April 9, 1957 D. M. CHAUVIN ET AL 2,788,397
WIDEBAND COMMUNICATIONS AMPLIFIER
Filed Nov. 10, 1953
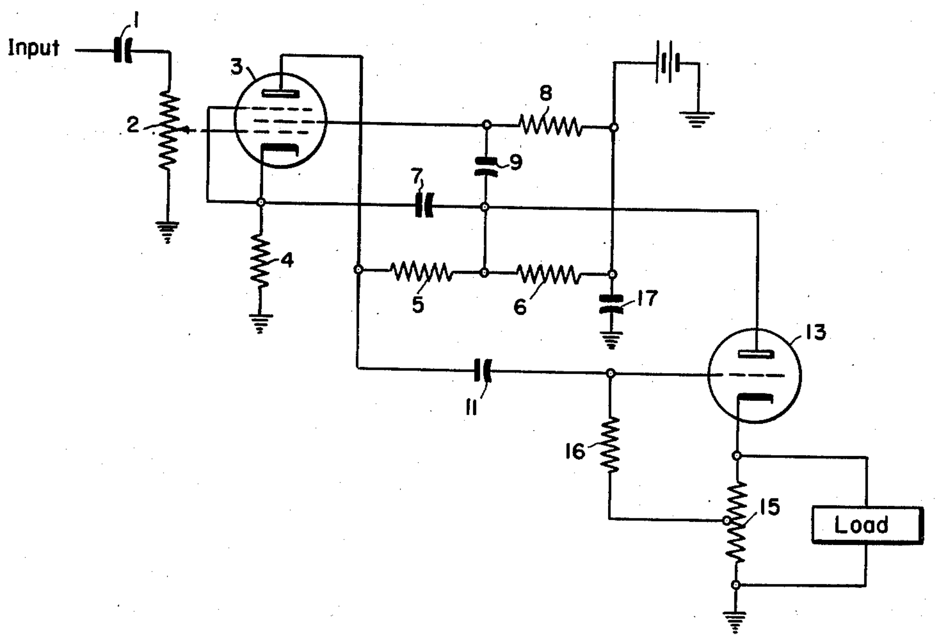
WITNESSES:
E. A. McCloskey
Leon J. Laza
INVENTORS
David M. Chauvin and
Wood Robinson.
BY
F. E. Browder
ATTORNEY United States Patent Office 2,788,397

Patented Apr. 9, 1957

2,788,397

WIDEBAND COMMUNICATIONS AMPLIFIER

David M. Chauvin, Glen Burnie, and Wood Robinson, Elkridge, Md., assignors to Westinghouse Electric Corporation, East Pittsburgh, Pa., a corporation of Pennsylvania Application November 10, 1953, Serial No. 391,342

2 Claims. (Cl. 179—171)

Our invention relates to amplifiers and, and in particular, comprises an amplifier adapted to take power from a high impedance source and furnish a substantially constant current output, whereby its operation is little affected by other amplifiers feeding current to the same load circuit. It is particularly well adapted to amplify the output of the discriminator in an FM system in which a number of amplifiers feed their outputs in multiple to a common load circuit of much lower impedance. Such a circuit is employed in a microwave point-to-point communication system, for example.

Communication systems which comprise a plurality of widely separated stations, such as pumping stations along a natural gas line or substations of an electric power system, are being extensively installed in which the carrier signals are beams of radio waves a few centimeters long which are transmitted between relay towers miles apart across country. The frequency of such waves is so high that a relatively narrow channel may be modulated to carry well over thirty sub-carrier signals simultaneously. Each of these sub-carrier signals may be modulated with a particular intelligence signal so that a plurality of voice or code communications may be carried on at the same time.

The microwave carrier signal of one such system is frequency modulated with the aforesaid sub-carrier signals. The output of the frequency discriminators employed in the receivers of such a system are of relatively high impedance compared with the local station circuits which they feed, and a plurality of such discriminators frequently feed a single load circuit. Furthermore, to be satisfactory, the amplifiers must produce substantial power gains without substantial distortion of the discriminator outputs.

One object of our invention is accordingly to provide an amplifier capable of feeding substantially constant current output signals to a load circuit.

Another object is to provide an amplifier capable of matching a high impedance input channel to a low impedance load circuit without substantial interference from current and voltage conditions over a wide range in the latter.

Another object is to provide an amplifier capable of receiving input from a high impedance circuit and of delivering a substantially constant current output to a low impedance circuit.

Still another object is to provide an amplifier capable of repeating currents from a high impedance circuit with substantial power gain and without substantial distortion in a low impedance circuit unaffected by other currents flowing therein.

Still another object is to provide an FM discriminator output with an amplifier capable of feeding into a low impedance circuit with substantial power gain but without distortion regardless of whether other channels are, or are not, feeding currents into the latter.

Still another object is to provide an amplifier having an output circuit which appears to be of high impedance when viewed from its load.

Yet another object is to provide a novel type of amplifier circuit.

Still another object is to provide an amplifier having a very flat frequency versus amplification characteristic over a very wide range of frequencies.

Other objects of our invention will become apparent upon reading the following description taken in connection with the drawing, in which the single figure is a schematic diagram of an amplifier circuit embodying the principles of our invention.

Referring in detail to the drawing, output of an FM discriminator or similar high impedance channel is impressed through a blocking capacitor 1 and voltage divider resistor 2 on the control-grid of an amplifier tube 3 which may be a pentode, which may be a section of a type 6U8 tube, having a cathode resistor 4 between its cathode and the ground. The terminal of the voltage divider resistor remote from the blocking capacitor 1 is connected to ground. The anode of tube 3 is connected through a pair of resistors 5 and 6 in series to the positive pole B+ of a direct-current source having its negative pole grounded, and the common junction of resistors 5 and 6 is connected to the cathode through a capacitor 7. The screen grid of pentode 3 is connected to the B+ pole through a resistor 8 and to said common junction through a capacitor 9.

The anode of tube 3 is also connected through a capacitor 11 to the control grid of a triode 13 which may be the other section of the above-mentioned 6U8 tube. The anode of triode 13 is connected to said common junction and its cathode is connected to ground through a cathode resistor 15. The control grid of triode 13 is connected through a resistor 16 to an intermediate tap on resistor 15. The load circuit is connected across resistor 15. The positive pole B+ is connected to ground through capacitor 17.

The tendency toward constancy of output to the load circuit results from negative feedback in several parts of the above circuits. The main negative feedback is transmittal of the voltages developed by plate current of triode 13 across resistor 6 through capacitor 7 to the cathode of pentode 3. Any change of plate current of triode 13 is opposed by a reaction in pentode 3. Voltage and impedance changes across the load of triode 13 over a wide range thus result in substantially no change in the plate current in triode 13. The plate circuit of triode 13 has the properties of a high impedance circuit. Other channels feeding the load thus have little effect on the output of tube 13, and the latter performs substantially as if isolated from them. This feedback also causes distortion of the input signals in the amplifier to be at a low level and produces a flat output versus frequency characteristic.

A second negative feedback effect results from the fact that resistor 6 is common to the plate circuits of both pentode 3 and triode 13.

A third negative feedback effect results from the absence of the usual bypass capacitor on the pentode cathode resistor 4, and a fourth negative feedback effect is produced by absence of a bypass capacitor about the triode cathode-resistor 15.

The connection of the screen grid of the pentode 3 through the capacitor 9 to the junction of resistors 5 and 6 results in a positive feedback effect which increases the amplifier gain by a factor of 10 percent without increasing the distortion. It may be noted that the feedback paths embrace neither the input nor the output current, yet the currents fed back from the triode plate are representative of the currents fed to the load, since the same signal current which flows through the load must also flow through the triode plate and resistor 6.

The effective high impedance of the amplifier output circuit when viewed from the load makes it possible by paralleling the output circuits of two or more of our amplifiers fed with input circuits of different frequency to provide an excellent mixer.

As a specific example of the above-described circuit, an amplifier which we have designed for a station on a microwave radio communication system has capacitors and resistors of the following values:

Capacitors (microfarads) 1–.05; 7–.25; 9–.05; 11–.01; 17–.01.

Resistors (ohms) 2–50K; 4–150; 5–15K; 6–330; 15-tap to ground 4700; 8–100K; 15-tap to cathode 150; 16–$10^6$.

The load circuit fed from resistor 15 has an impedance of about 200 ohms. This circuit with the capacitor and resistor values above-listed has a characteristic connecting frequency with amplification that is practically flat over a range extending from about five thousand cycles per second to six hundred kilocycles per second. If the capacitor 7 is given a value of about 10μf, then the amplifier response is flat over a range extending from about two hundred cycles per second to over six hundred kilocycles per second.

While we have illustrated our invention by describing a particular embodiment, its principles are applicable in other ways which will be evident to those skilled in the art. We, therefore, intend that the terms of the following claims shall be given the broadest interpretation which is reasonable in view of the prior art.

We claim as our invention:

1. An amplifier comprising a first electron discharge device having an anode, a cathode, a control grid and a screen grid included therein, a second electron discharge device having an anode, cathode and control grid included therein, a common source of anode voltage for said first and second discharge devices, a first cathode resistor connecting the cathode of said first device to the negative terminal of said anode voltage source, first and second anode resistors connecting the anode of said first device to the positive terminal of said anode voltage source, a resistor connecting the screen grid of said first device to the positive terminal of said anode voltage source, a first capacitor coupling the junction of said first and second anode resistors to the cathode of said first discharge device, a second capacitor coupling said junction to the screen grid of said first discharge device, a third capacitor coupling the anode of said first discharge device to the control grid of said second discharge device, a connection between the anode of said second discharge device and the junction of said first and second anode resistors, a second cathode resistor connecting the cathode of said second discharge device to the negative terminal of said anode voltage source, and a resistor connecting the control grid of said second discharge device to an intermediate point on said second cathode resistor.

2. The combination claimed in claim 1 and including a capacitor connected between the positive and negative terminals of said anode voltage source.

References Cited in the file of this patent

UNITED STATES PATENTS

| | | |
|---|---|---|
| 2,034,226 | Carter | Mar. 17, 1936 |
| 2,220,770 | Mayer | Nov. 5, 1940 |
| 2,447,248 | Harris | Aug. 17, 1948 |
| 2,541,326 | Bielek | Feb. 13, 1951 |

FOREIGN PATENTS

| | | |
|---|---|---|
| 516,358 | Great Britain | Jan. 1, 1939 |